United States Patent
Halbritter et al.

(10) Patent No.: US 10,439,104 B2
(45) Date of Patent: Oct. 8, 2019

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventors: Hubert Halbritter, Dietfurt (DE); Ines Pietzonka, Donaustauf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/775,789

(22) PCT Filed: Nov. 29, 2016

(86) PCT No.: PCT/EP2016/079144
§ 371 (c)(1),
(2) Date: May 11, 2018

(87) PCT Pub. No.: WO2017/093257
PCT Pub. Date: Jun. 8, 2017

(65) Prior Publication Data
US 2018/0331258 A1    Nov. 15, 2018

(30) Foreign Application Priority Data

Nov. 30, 2015   (DE) .................. 10 2015 120 778

(51) Int. Cl.
*H01L 21/00* (2006.01)
*H01L 33/18* (2010.01)
(Continued)

(52) U.S. Cl.
CPC ........ *H01L 33/18* (2013.01); *H01L 21/02603* (2013.01); *H01L 33/10* (2013.01);
(Continued)

(58) Field of Classification Search
CPC ............. H01L 51/0049; H01L 51/0048; H01L 2924/13061; H01L 29/0669; H01L 21/0261
See application file for complete search history.

(56) References Cited

U.S. PATENT DOCUMENTS 9,551,647 B2 *  1/2017  Thomsen ............. G01N 21/255
2009/0267049 A1  10/2009  Cho et al.
(Continued)

FOREIGN PATENT DOCUMENTS

| DE | 102012101718 A1 | 9/2013 |
|---|---|---|
| DE | 102013104273 A1 | 10/2014 |
| WO | 2014/207378 A1 | 12/2014 |

*Primary Examiner* — Nicholas J Tobergte
(74) *Attorney, Agent, or Firm* — McDermott Will & Emery LLP

(57) ABSTRACT

The invention relates to an optoelectronic component (10), comprising a carrier (1) and a plurality of nanorods (2), which are arranged on the carrier (1), wherein the nanorods (2) each comprise an active zone (2d). Furthermore, the optoelectronic component (10) comprises a potting compound (3), which is arranged on the carrier (1) and at least partially embeds the nanorods (2), and a structured metallization (5), which laterally surrounds the nanorods (2), wherein the nanorods (2) extend in a longitudinal direction N, the structured metallization (5) extends in a longitudinal direction M, and the longitudinal direction M of the structured metallization (5) extends transversely to the longitudinal direction N of the nanorods (2).

15 Claims, 2 Drawing Sheets

Figure 1A:
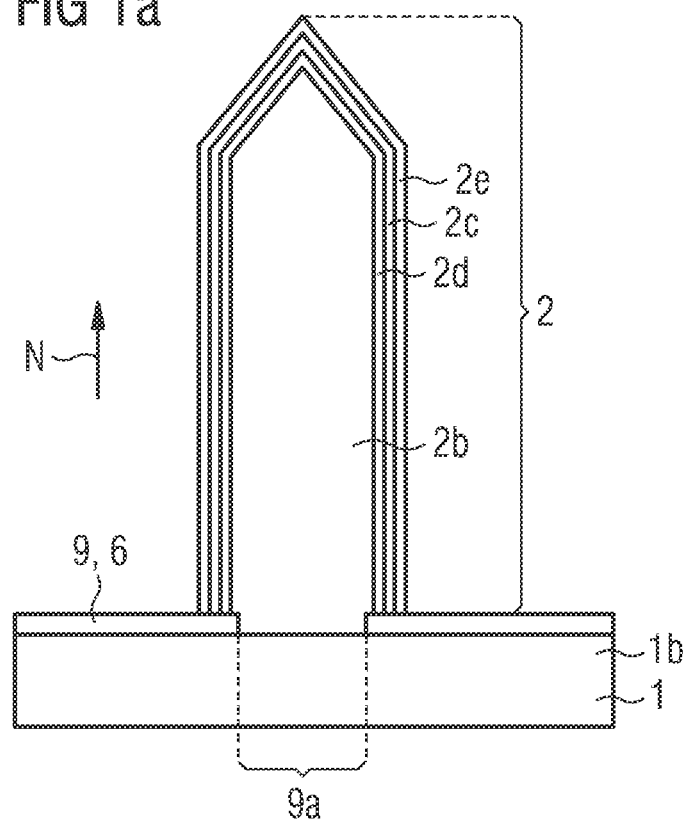

(51) Int. Cl.
*H01L 33/10* (2010.01)
*H01L 33/36* (2010.01)
*H01L 21/02* (2006.01)
H01L 29/06 (2006.01)
H01L 51/00 (2006.01)
B82Y 10/00 (2011.01)

(52) U.S. Cl.
CPC ............. *H01L 33/36* (2013.01); *B82Y 10/00* (2013.01); *H01L 21/02601* (2013.01); *H01L 29/0669* (2013.01); *H01L 51/0048* (2013.01); *H01L 51/0049* (2013.01)

(56) References Cited

U.S. PATENT DOCUMENTS

| | | | |
|---|---|---|---|
| 2012/0061646 A1* | 3/2012 | Yi | H01L 33/24 257/13 |
| 2012/0273762 A1 | 11/2012 | Scherer et al. | |
| 2013/0140521 A1* | 6/2013 | Gilet | H01L 33/04 257/13 |
| 2013/0240241 A1* | 9/2013 | Dubrow | H01B 3/004 174/113 R |
| 2014/0326945 A1 | 11/2014 | Gerard et al. | |
| 2016/0141450 A1* | 5/2016 | Herner | H01L 33/0095 257/13 |
| 2017/0229668 A1* | 8/2017 | Stapleton | H01J 1/304 |

* cited by examiner

OPTOELECTRONIC COMPONENT AND METHOD FOR PRODUCING AN OPTOELECTRONIC COMPONENT

The invention relates to an optoelectronic component and to a method for producing an optoelectronic component.

An object to be achieved is to shorten switching-on and switching-off times of an optoelectronic component and to accelerate a spontaneous emission of the optoelectronic component and to specify a method for producing such an optoelectronic component.

This object is achieved by an optoelectronic component and a method according to the independent patent claims. Advantageous embodiments and further developments of the invention are the subject of the dependent claims.

According to at least one embodiment, the optoelectronic component comprises a carrier and a plurality of nanorods, which are arranged on the carrier, wherein the nanorods each comprise an active zone. A potting compound is advantageously arranged on the carrier, wherein said potting compound at least partially embeds the nanorods. Furthermore, a structured metallization advantageously surrounds the nanorods laterally, wherein the nanorods extend along a longitudinal direction N, the structured metallization extends along a longitudinal direction M, and the longitudinal direction M of the structured metallization extends transversely to the longitudinal direction N of the nanorods. For example, the structured metallization extends perpendicular to the longitudinal direction N of the nanorods.

The carrier may comprise a substrate, for example sapphire. Furthermore, a semiconductor layer can be arranged on the carrier, which advantageously covers the carrier throughout its entire area. This is advantageously an n- or p-doped semiconductor material, for example n-doped GaN. The plurality of nanorods is advantageously grown epitaxially on the carrier so that the nanorods extend perpendicularly to an upper side of the carrier away from the latter. The nanorods advantageously themselves comprise an n-doped and a p-doped semiconductor material, wherein in the case where the semiconductor layer on the carrier is n-doped, the n-doped semiconductor material of the nanorods directly adjoins the n-doped semiconductor material on the carrier. In this case, the n-doped semiconductor material on the carrier and the n-doped semiconductor material of the nanorods may advantageously be the same materials, which are advantageously also electrically connected to one another.

To stabilize the nanorods they are encapsulated by a potting compound, so that advantageously a cured potting compound fixes the nanorods in the component and the risk of breakage or tipping of the nanorods is reduced. The potting compound surrounds the nanorods laterally and up to a height H along their longitudinal direction N. Advantageously, the potting compound surrounds the nanorods at height H at least in half. The height H of the potting compound can advantageously be adapted to the aspect ratio of the nanorods, for example, thick nanorods can be less than half potted in their height and thin nanorods more than half potted in their height.

The structured metallization is advantageously embedded by the potting compound or lies on the potting compound. The structured metallization has no direct electrical contact with the nanorods, advantageously there is a narrow gap between the surface of the nanorods and the structured metallization. The structured metallization advantageously acts as an antenna for the radiation emitted by the nanorods. Advantageously, by means of the structured metallization, a spontaneous recombination rate in the active zone of the nanorods can be significantly increased based on quantum mechanical effects, as a result of which spontaneous emission at the nanorod is increased.

By using a structured metallization as an antenna switching-on and switching-off times of light-emitting components, in particular LEDs, can be significantly reduced by means of the achieved increase in the spontaneous emission rate. After spontaneous emission, photons are advantageously emitted via the antenna. Advantageously, in this case the application of non-radiative loss mechanisms to shorten the switching times can be skipped. Non-radiative loss mechanisms can be achieved, for example, by further doping in semiconductor material by changing the recombination rates. Loss mechanisms can also be absorption, Shockley read-hall mechanisms (point defects) and others. By means of the antenna, switching-on and switching-off times can be shortened without the occurrence of a significant loss of efficiency in the emission. The antenna can be designed as a dipole.

Furthermore, a typical decrease in the optical power (droop) of the component with increasing charge carrier current in the component, in particular for blue LEDs, can be reduced by means of the antenna. The optical radiated power increases proportionally with the current of the charge carriers in the optoelectronic component (semiconductor), whereby due to the so-called Auger-Meitner recombination no increase in the optical power occurs above a certain carrier current. This is especially noticeable for blue LEDs. By means of the antenna, the threshold value for the carrier current, from which the optical power no longer increases, can be increased, in other words the Auger-Meitner recombination can be counteracted in a certain range.

According to at least one embodiment of the optoelectronic component, a further potting compound is arranged on the structured metallization and on the potting compound. The potting compound may comprise a dielectric material. Advantageously, the further potting compound can be arranged in the component, wherein, for example, the potting compound embeds the nanorods up to a height H, the structured metallization lies on the potting compound and the further potting compound is arranged on the structured metallization and the potting compound. It is also possible that the further potting compound fully embeds the nanorods above the structured metallization. The potting compounds may advantageously comprise different materials. For example, the potting compounds each comprise a dielectric, the dielectric constants of the potting compounds advantageously differing from one another. Differences in the dielectric constants can advantageously influence the emission direction of the radiation emitted by the antenna and the nanorods. Thus, for example, the potting compound can have a greater dielectric constant than the further potting compound, whereby an emission in the direction away from the carrier is preferred.

According to least one embodiment of the optoelectronic component, the optoelectronic component is a light emitting chip. The component can advantageously be formed as an LED with a plurality of nanorods and a structured metallization in the form of a plurality of antennas for the nanorods.

According to at least one embodiment of the optoelectronic component, a reflective layer is arranged between an upper side of the carrier and the potting compound. The reflective layer can advantageously be structured and have recesses in which the nanorods are grown. By means of the width of the recesses, it is possible to influence the thickness of the nanorods and, with the arrangement of the recesses, the distribution of the nanorods in the component. Advantageously, the reflective layer extends throughout the entire area between the nanorods so that the entire upper side of the carrier between the nanorods is covered by the reflective layer.

According to at least one embodiment of the optoelectronic component, the nanorods are electrically contacted by means of the reflective layer.

According to at least one embodiment of the optoelectronic component, the nanorods are electrically contacted by a side facing the carrier and by a side facing away from the carrier. An electrical contacting of the nanorods advantageously takes place via the carrier itself, in particular via the semiconductor layer of the carrier, for example the n- or p-doped semiconductor layer of the carrier, and furthermore via conductor tracks in the reflective layer or via the reflective layer itself. Alternatively, it is also possible to contact the nanorods from a side facing the carrier by means of the reflective layer and at the same time to contact via a contact structure from a side of the nanorods facing away from the carrier, if no semiconductor layer is present in the carrier or contact is not made via the semiconductor layer. The electrical contact on a side of the nanorods facing away from the carrier can be realized by means of a cover, for example a lid with which the component is covered.

According to at least one embodiment of the optoelectronic component, in each case one region B of the structured metallization is associated with the nanorods on a one-to-one basis. In other words, each nanorod is advantageously assigned exactly one antenna. The structured metallization therefore advantageously comprises a multiplicity of spatially separated regions B.

According to at least one embodiment of the optoelectronic component, an expansion of the regions B around the nanorods in each case is adapted to an emission wavelength $\lambda$ of the light emitted by the nanorod in accordance with $\lambda/2$ or $\lambda/4$.

For each nanorod, an ideal antenna length can be selected for emission of light of the emission wavelength, such that the extent of the region B along the longitudinal direction M and around a nanorod corresponds to $\lambda/2$ or $\lambda/4$, for example in its entirety or in its length on each side of the nanorod, respectively. Furthermore, it is advantageously possible to adapt the extent of the regions B to an ideal antenna for the medium surrounding the nanorod.

According to at least one embodiment of the optoelectronic component, the nanorods are at least partially covered by a dielectric layer on a surface. In addition to the potting compound, the dielectric layer may surround and electrically insulate the nanorods. The dielectric layer is advantageously located between the surface of the nanorods and the potting compound. Furthermore, the radiation of the nanorods and the antenna can be advantageously influenced by means of the choice of the material of the dielectric layer. The dielectric layer may advantageously fill the gap between the nanorod and the structured metallization running around the nanorod.

According to at least one embodiment of the optoelectronic component, the nanorods comprise at least one material from the material systems AlGaInP, InAlGaAs or InAlGaN.

The semiconductor materials of the nanorods and of the carrier are advantageously semiconductors based on III-V semiconductor materials. For example, the semiconductors are based on a nitride compound semiconductor material such as $Al_nIn_mGa_{1-n-m}N$ or on a phosphide compound semiconductor material such as $Al_nIn_mGa_{1-n-m}P$ or on $Al_nIn_mGa_{1-n-m}As$, where $0\leq n\leq 1$, $0\leq m\leq 1$ and $n+m\leq 1$. This material may have one or more dopants and additional constituents. For the sake of simplicity, however, only the essential components of the crystal lattice, i.e. Al, Ga, In, N or P or As, are listed, even if these can be partially replaced and/or supplemented by small amounts of further substances. By choosing the semiconductor materials, an emission in infrared, red, green or blue can be achieved.

According to at least one embodiment of the optoelectronic component, the nanorods have a core-shell structure. The nanorods may comprise a first semiconductor material in the interior, which comprises a p- or an n-doped semiconductor material and which is advantageously grown first on the carrier during the production of the nanorod. The first semiconductor material extends in a longitudinal direction N away from the carrier. On the outer face of the first semiconductor material, the first semiconductor material is advantageously surrounded by an active layer or a second semiconductor material, wherein the second semiconductor material is doped opposite to the first semiconductor material. In other words, the first semiconductor material may be n-doped and the second semiconductor material may be p-doped or vice versa. The nanorods may also include other materials with quantum well structures. The nanorods can advantageously be surrounded by an insulating material which electrically insulates the nanorods to the outside. Furthermore, it is possible for the nanorods to have a tip on a side facing away from the carrier, for example a cone tip or a pyramid tip.

According to at least one embodiment of the optoelectronic component, the nanorods comprise a layer sequence, wherein a p-layer, an active layer and an n-layer follow one another vertically. The nanorods can be stacked vertically as an alternative to the core-shell design. A first semiconductor material may advantageously comprise a p- or an n-doped semiconductor material. The first semiconductor material being the first layer of the nanorod faces the carrier. The first semiconductor material is followed in a vertical direction away from the surface of the carrier by further layers, such as an active layer and/or a second doped semiconductor layer, which is oppositely doped to the first semiconductor layer.

According to at least one embodiment of the optoelectronic component, the optoelectronic component has a switching-on and/or switching-off time for light emission of less than or equal to 1 ns. With switching-on and/or switching-off times of less than 1 ns, the optoelectronic component reaches switching-on and/or switching-off times, which are comparable to lasers. In this case, an almost constant emission efficiency is advantageously achieved, in other words the spontaneous emission is accelerated, which advantageously does not occur at the expense of efficiency.

A method for producing the optoelectronic component comprises growing a plurality of nanorods on a support so that the nanorods extend in a growth direction away from an upper side of the support. Furthermore, the method comprises arranging a potting compound on the carrier, so that the potting compound embeds the nanorods up to a height H. The method includes applying a structured metallization to the potting compound so that the structured metallization at least partially laterally surrounds the nanorods.

The nanorods can be grown as a core-shell structure or as a vertically layered structure, wherein it is possible to grow the nanorods on a support, which itself comprises a semiconductor material and which is provided with a structured mask, which has recesses in which the nanorods grown can be. The nanorods can be grown away from the support, formed with tips or cut off at a constant height, and a cover can be placed on the nanorods, in particular a contact. On the other hand, it is also possible to form the nanorods on a growth substrate, advantageously to grow them vertically thereon, to arrange the nanorods with a side facing away from the growth substrate on a support and to subsequently remove the growth substrate.

According to at least one embodiment of the method, a structured mask is applied to the carrier, which has recesses in which the nanorods are grown epitaxially.

The growth of the nanorods can be carried out, for example, by means of MOVPE, Molecular Beam Epitaxy (MBE) or Pulsed Laser Deposition (PLD). The recesses can be distributed homogeneously over the carrier or a specific inhomogeneous light intensity of the component can be achieved by an inhomogeneous distribution of the recesses and consequently the nanorods.

Further advantages, advantageous embodiments and developments arise from the embodiment described below in conjunction with the figures.

Figure 1B:
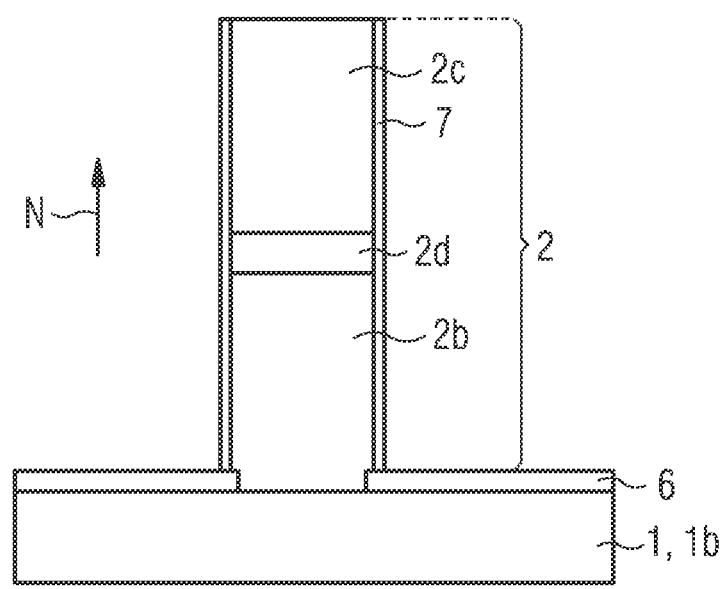

As shown in:

FIGS. 1a and 1b a schematic side view of a cross section through a nanorod.

Figure 2:
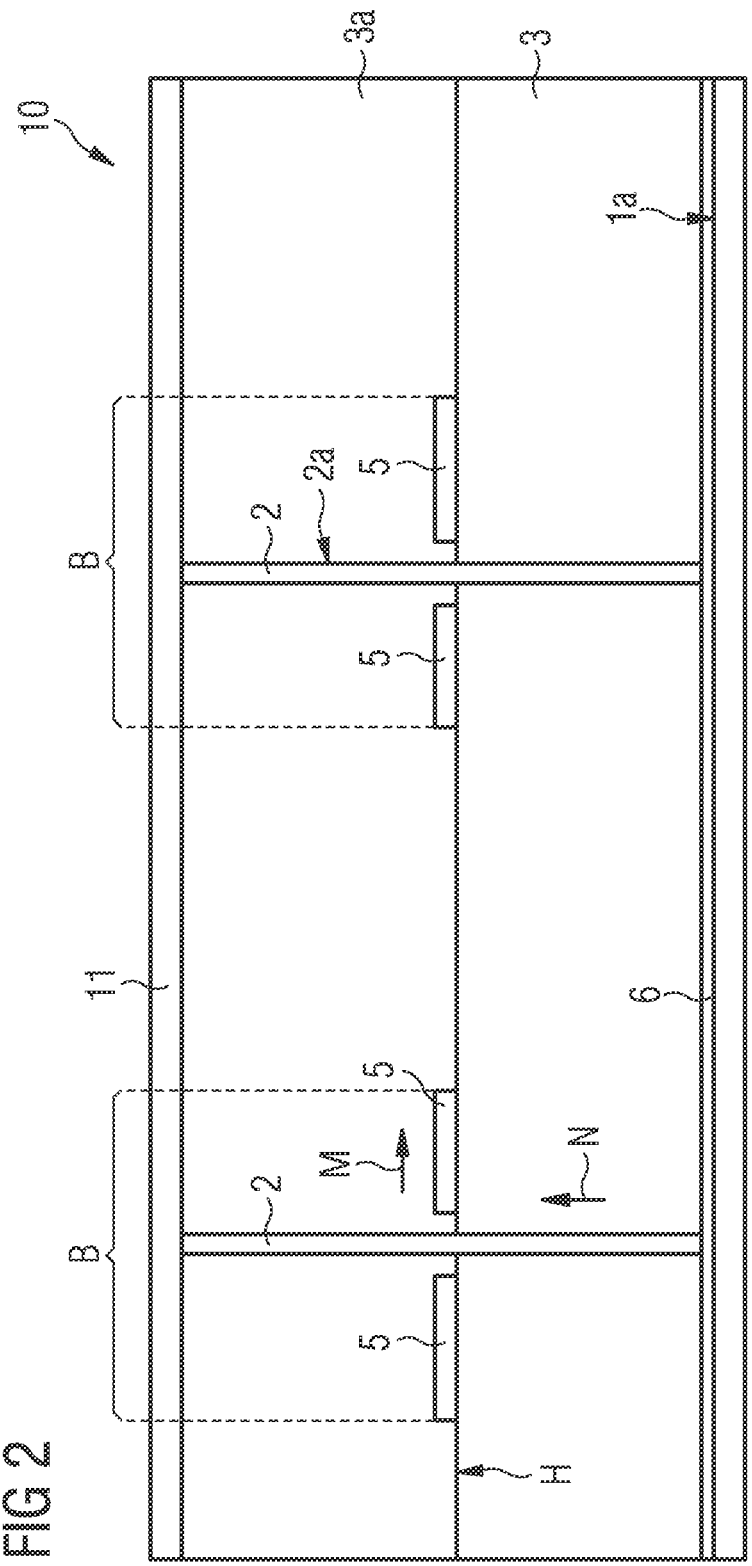

FIG. 2 a schematic side view of an optoelectronic component with nanorods.

Identical or equivalent elements are each provided with the same reference numerals in the figures. The components shown in the figures and the size ratios of the components with each other are not to be regarded as true to scale.

FIG. 1a shows the structure of a nanorod 2, which has a core-shell structure. The nanorod 2 is arranged on a carrier 1 and advantageously arranged in a recess 9a of the carrier 1 in a reflective layer 6, wherein the nanorod 2 is advantageously epitaxially grown from this recess in the direction away from the top side 1a of the carrier 1. The nanorod has a longitudinal direction N along which it extends vertically away from the carrier 1. The nanorod 2 has a first semiconductor material 2b, which forms the core of the nanorod 2 and which is directly connected to a semiconductor material 1b of the carrier 1 and electrically contacted. The first semiconductor material 2b and the semiconductor material 1b of the carrier 1, for example, both comprise n-GaN. Furthermore, the nanorod 2 comprises a second semiconductor material 2c, which circumferentially surrounds the first semiconductor material 2b. The second semiconductor material 2c has, for example, a p-doped GaN layer. Between the first semiconductor material 2b and the second semiconductor material 2c, the nanorod 2 may comprise an active layer 2d, which likewise envelops the first semiconductor material 2b. The active layer 2d advantageously comprises several layers, for example with quantum well structures. The nanorod 2 is electrically insulated from the environment by means of a dielectric layer 2e. The contacting of the second semiconductor material 2c takes place, for example, by means of conductor tracks on the reflective layer 6 or by means of the reflective layer 6 itself. In this case, it is necessary for the first semiconductor material 2b and the semiconductor material 1b of the carrier 1 to be insulated from the reflective layer 6. The reflective layer 6 may be formed, for example, as a mask 9 with recesses 9a and may comprise $SiO_2$. The first semiconductor material 2b in the form of the n-GaN core may have a thickness of a few nm to several hundred nm, for example 100 nm.

Furthermore, it is possible for the nanorod 2 to have a tip on a side facing away from the carrier 1, for example a cone tip or a pyramid tip.

FIG. 1b shows, in a schematic side view, the cross section through a nanorod 2, which comprises the first semiconductor material 2b, the active layer 2d and the second semiconductor material 2c in a vertical layer structure. Along a longitudinal direction N, the layers 2b, 2d and 2c are arranged in successive order away from the carrier 1. Contacting of the first semiconductor material 2b advantageously takes place from the side facing the carrier 1 by means of the semiconductor material 1b of the carrier 1. The contacting of the second semiconductor material 2c takes place from a side of the nanorod 2 facing away from the carrier 1, for example via a cover. Furthermore, the vertically layered nanorod 2 may be surrounded by a dielectric layer 7 in order to insulate the semiconductor materials from the environment, wherein the dielectric layer 7 on a side of the nanorod 2 facing away from the carrier 1 does not cover the nanorod.

FIG. 2 shows a schematic side view of an optoelectronic component 10 with a plurality of nanorods 2. For the sake of simplicity, only two nanorods 2 are shown in FIG. 2, although the optoelectronic component 10 is shaped as a chip, for example an LED, and includes a multiplicity of nanorods 2.

FIG. 2 shows a carrier 1 on which a reflective layer 6 with recesses 9a is arranged. The nanorods 2 extend from the recesses along a longitudinal direction N away from the upper side 1a of the carrier. The nanorods 2 are potted with a potting compound 3 which completely surrounds the nanorods 2 laterally up to a height H. The potting compound 3 comprises, for example, epoxy and, after hardening, prevents the nanorods 2 from breaking or tipping over. At the height H, a structured metallization 5 is arranged on the potting compound 3, which advantageously comprises a metallic material such as Au or ITO. The structured metallization 5 advantageously has a plurality of regions B, with each nanorod 2 being assigned to one region B on a one-to-one basis, said region extends as an antenna around the respective nanorod 2 in a longitudinal direction M transverse to the nanorod 2. The structured metallization 5 and the nanorod 2 are not in direct contact with each other, thereby avoiding electrical conduction and thus short circuits between the nanorod and the antenna.

On the potting compound 3 and the structured metallization 5, a further potting compound 3a is arranged, which advantageously completely covers the potting compound 3 and the structured metallization 5. The two potting compounds 3 and 3a can advantageously comprise different materials, in particular different dielectric constants. In this case, by means of the dielectric and optical properties of the two potting compounds 3 and 3a, the radiation direction of the antenna and the nanorod can be influenced. The further potting surrounds the nanorods 2 advantageously laterally completely between the height H and the upper side of the nanorods 2, which faces away from the carrier. On the further potting compound 3a, a cover 11 in the form of a lid is advantageously arranged, which completely covers the further potting compound 3a and electrically contacts the nanorods 2. The emission direction of the optoelectronic component 10 may, for example, run parallel to the cover 11 and perpendicular to the antenna or through the cover 11.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

This patent application claims the priority of German Patent Application 102015120778.8, the disclosure of which is hereby incorporated by reference.

REFERENCE NUMBER LIST 1 carrier
1a upper side of the carrier
1b semiconductor material
2 nanorod
2a surface
2b first semiconductor material
2c second semiconductor material
2d active layer
2e dielectric layer
3 potting compound
3a further potting compound
5 structured metallization
6 reflective layer
7 dielectric layer
9 mask
9a recess
10 optoelectronic component
11 cover
B region
H height
M longitudinal direction
N longitudinal direction

The invention claimed is:

1. Optoelectronic component, comprising:
a carrier,
a plurality of nanorods arranged on the carrier, wherein the nanorods each comprise an active zone,
a potting compound which is arranged on the carrier and which at least partially embeds the nanorods, and
a structured metallization, which laterally surrounds the nanorods, wherein
the nanorods extend along a longitudinal direction N,
the structured metallization extends along a longitudinal direction M, and
the longitudinal direction M of the structured metallization runs transversely to the longitudinal direction N of the nanorods,
wherein in each case a region B of the structured metallization is associated with the nanorods on a one-to-one basis, and an expansion of the region B around the nanorods in each case is adapted to an emission wavelength $\lambda$ of the light emitted by the nanorod in accordance with $\lambda/2$ or $\lambda/4$.

2. Optoelectronic component according to claim 1, in which a further potting compound is arranged on the structured metallization and on the potting compound.

3. Optoelectronic component according to claim 1, in which the optoelectronic component is a light emitting chip.

4. Optoelectronic component according to claim 1, in which a reflective layer is arranged between an upper side of the carrier and the potting compound.

5. Optoelectronic component according to claim 4, in which the nanorods are electrically contacted by means of the reflective layer.

6. Optoelectronic component according to claim 1, in which the nanorods are electrically contacted by a side facing the carrier and by a side facing away from the carrier.

7. Optoelectronic component according to claim 1, in which the nanorods are at least partially covered by a dielectric layer on a surface.

8. Optoelectronic component according to claim 1, in which the nanorods comprise at least one material from the material systems AlGaInP, InAlGaAs or InAlGaN.

9. Optoelectronic component according to claim 1, in which the nanorods have a core-shell structure.

10. Optoelectronic component according to claim 1, in which the nanorods comprise a layer sequence, wherein a p-layer, an active layer and an n-layer follow one another vertically.

11. Optoelectronic component according to claim 1, in which the optoelectronic component has an switching-on and/or switching-off time for light emission of less than or equal to 1 ns.

12. A method for producing an optoelectronic component with the steps:
growing a plurality of nanorods on a carrier such that the nanorods extend away from an upper side of the carrier along a growth direction,
arranging a potting compound on the carrier so that the potting compound embeds the nanorods up to a height H, and
applying a structured metallization on the potting compound so that the structured metallization surrounds the nanorods at least partially laterally,
wherein in each case a region B of the structured metallization is associated with the nanorods on a one-to-one basis, and an expansion of the region B around the nanorods in each case is adapted to an emission wavelength $\lambda$ of the light emitted by the nanorod in accordance with $\lambda/2$ or $\lambda/4$.

13. A method for producing an optoelectronic component according to claim 12,
in which a structured mask is applied to the carrier, which has recesses in which the nanorods are grown epitaxially.

14. Optoelectronic component, comprising
a carrier,
a plurality of nanorods arranged on the carrier, wherein the nanorods each comprise an active zone,
a potting compound which is arranged on the carrier and which at least partially embeds the nanorods, and
a structured metallization, which laterally surrounds the nanorods, wherein
the nanorods extend along a longitudinal direction N,
the structured metallization extends along a longitudinal direction M, and
the longitudinal direction M of the structured metallization runs transversely to the longitudinal direction N of the nanorods, wherein the structured metallization is configured to act as an antenna for the radiation emitted by the nanorods.

15. A method for producing an optoelectronic component with the steps:
growing a plurality of nanorods on a carrier such that the nanorods extend away from an upper side of the carrier along a growth direction,
arranging a potting compound on the carrier so that the potting compound embeds the nanorods up to a height H, and
applying a structured metallization on the potting compound so that the structured metallization surrounds the nanorods at least partially laterally, wherein the structured metallization is configured to act as an antenna for the radiation emitted by the nanorods.

\* \* \* \* \*